June 12, 1973 R. C. MILLER 3,738,927

ASYMMETRICAL CONTROLLED CURRENT ELECTROPLATING

Filed April 23, 1971 2 Sheets-Sheet 1

INVENTOR
R.C. MILLER
BY [signature]
ATTORNEY 3,738,927

ASYMMETRICAL CONTROLLED CURRENT ELECTROPLATING

Richard C. Miller, Sinking Spring, Pa., assignor to Western Electric Company, Incorporated, New York, N.Y.
Filed Apr. 23, 1971, Ser. No. 136,781
Int. Cl. B01k *3/00;* G05f *5/00*
U.S. Cl. 204—228 7 Claims

ABSTRACT OF THE DISCLOSURE

Gold is electroplated onto integrated circuits formed on a slice of silicon with asymmetrical alternating current. A unique current control unit provides consistency of the plating current even though the concentration of a plating solution may change during the plating operation.

The current control unit includes an NPN transistor and a PNP transistor with both outputs of the transistors connected in parallel to a terminal that contacts the silicon slice during plating thereof. A conventional source of symmetrical alternating current is connected to the emitter of the two transistors through a potentiometer. The potentiometer is adjusted to provide a desired ratio between the current carried through the NPN transistor and the current carried through the PNP transistor.

A separate means of biasing is provided so that the current through the transistors can be accurately controlled. The PNP transistor is biased to conduct a positive portion of the wave shape and the NPN transistor is biased to conduct a negative portion of the wave shape.

Thus, by establishing the desired ratio with the potentiometer, a controlled degree of asymmetry can be achieved. By controlling the level of biasing, a controlled magnitude of current can also be provided to the plating operation.

BACKGROUND OF THE INVENTION

Field of the invention

The invention relates to electroplating articles with asymmetrical alternating current and, more particularly, to methods and apparatus for accurately controlling the degree of asymmetry and magnitude of the alternating current.

Description of the prior art

In the fabrication of beam-lead integrated circuits, the beam leads are formed by electroplating gold to a desired thickness. It has been found useful in such plating to use asymmetrical alternating-current. With this type of plating, gold is deposited while the current is negative and removed while the current is positive. For example, the ratio of negative-to-positive current might be in the order of magnitude of 3:1. With such a degree of asymmetry, gold is deposited at approximately three times the rate at which it is removed. Thus, a net accumulation of gold results.

As compared to conventional direct-current plating, asymmetrical alternating-current plating results in a more desirable deposition of metal. Apparently, this is because polarization caused by release of hydrogen from the plating bath is reduced. The reduction of polarization results in improved plating adherence and less porosity than that usually achieved with direct-current plating.

The control of plating current in an asymmetrical alternating-current plating arrangement has been difficult. First of all, the magnitude of current both in the positive and negative portions of the cycle must be controlled accurately. Secondly, the degree of asymmetry must be accurately controlled. Each of these controls must be achieved in a situation where concentrations of salts in a plating bath are continuously changing as plating of metal onto workpieces progresses. In other words, for accurate plating results, the plating current must be independent of the plating bath concentration.

SUMMARY OF THE INVENTION

It is, therefore, an object of this invention to provide an accurately controlled, asymmetrical alternating-current control unit wherein the magnitude of current and degree of asymmetry are independent of the load to which the current is applied.

Another object of the invention is to provide a system for electroplating wherein an asymmetrical alternating current is applied to a plating bath and is controlled independently of the concentration of salts in the bath.

These objects are achieved by providing a controlled voltage, alternating-current control unit connected to a first electronic device having a high output impedance arranged to conduct positive currents and a second electronic device having a high output impedance arranged to conduct negative currents. The input currents to the devices are controlled to provide a desired ratio between the positive and negative currents. The output currents of the devices are controlled independently of the load and the ouput currents are applied in parallel to the load to provide the load with a controlled asymmetrical alternating current.

BRIEF DESCRIPTION OF THE DRAWINGS

Other objects and features of the present invention will be more readily understood from the following detailed description of specific embodiments thereof when read in conjunction with the appended drawings in which.

DETAILED DESCRIPTION

Illustratively, the invention will be described in connection with electroplating of gold onto slices of silicon having integrated circuits formed on one surface thereof. However, it is to be understood that the inventive current control system would function equally well in the electroplating of virtually any article where asymmetrical alternating current is desired as the plating energy. Additionally, the control system could function in any circumstances where controlled asymmetrical alternating current is desired, including areas outside the field of electroplating.

Figure 1:
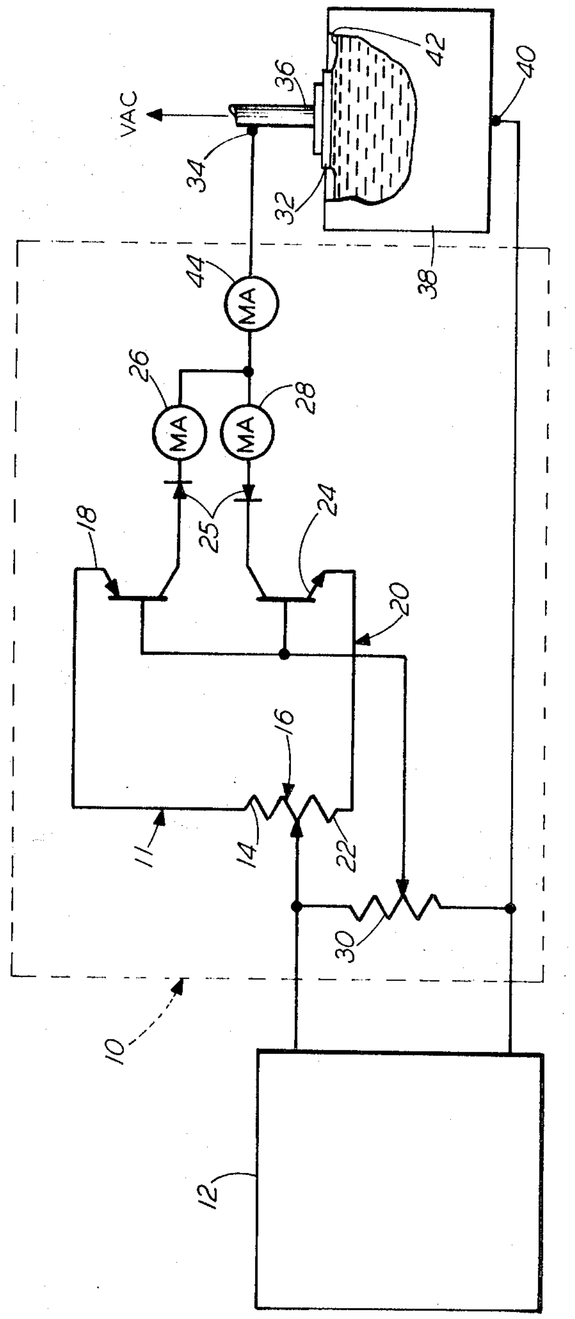
FIG. 1 is a schematic drawing of a control unit capable of achieving a desired control of asymmetrical alternating current and being connected to a workpiece in an electroplating environment.

An inventive current control unit, designated generally by the numeral 10, is illustrated within the dotted lines of FIG. 1. The control unit 10 includes two current paths. A first path, designated generally by the numeral 11, conducts positive portions of an alternating current supplied by a conventional alternating-current power supply 12. The path 11 includes a first resistance leg 14 of a potentiometer, designated generally by the numeral 16. An electronic device 18, for example, a PNP transistor, is also a part of the current path 11. The electronic device 18 permits conduction only of positive portions of the alternating current.

A second current path, designated generally by the numeral 20, conducts negative portions of the alternating current from the power supply 12. The negative currents are conducted through a second resistance leg 22 of the potentiometer 16 and through an electronic device 24, such as an NPN transistor.

Isolation diodes 25 are provided in each of the two current paths 11 and 20 to protect the devices 18 and 24, The devices 18 and 24 must have a very high output impedance in order to function successfully as current regulators. With a high output impedance, the devices can be made to control current through the paths 11 and 20 irrespective of the load to which the current is being applied.

Figure 2:
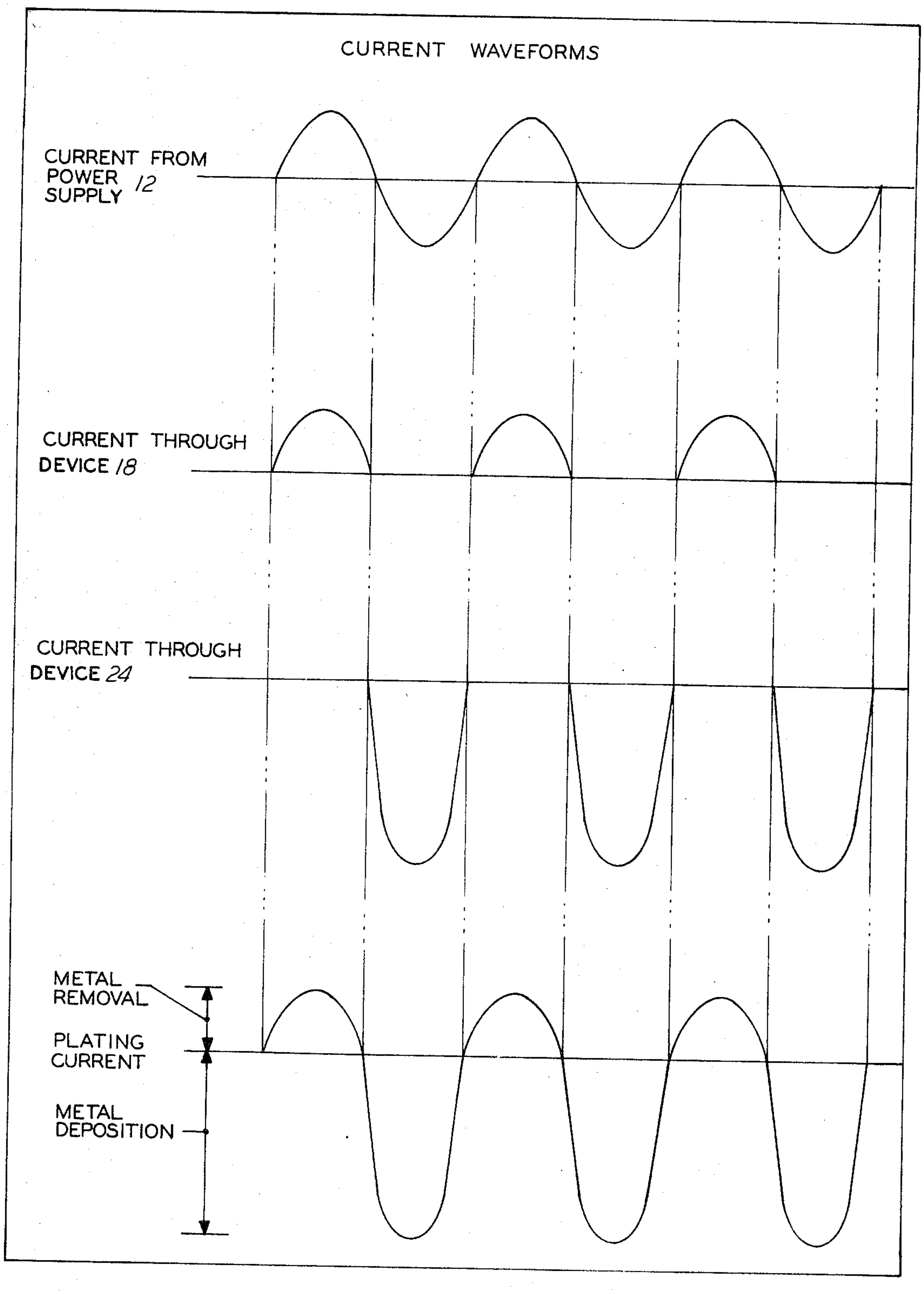
FIG. 2 is a set of current waveforms illustrating the operation of the control unit of FIG. 1.

It can be seen that if the devices 18 and 24 were, in fact, a complementary pair of transistors, they would conduct an equal amount of current when the resistance legs 14 and 22 of the potentiometer 16 were made equal. If, however, the resistance of the leg 22 is made smaller than the resistance of the leg 14, for example, by a ratio of 3:1, the collector current of the device 18 would be only one-third as great as the collector current of the device 24. In other words, the currents through the devices 18 and 24 would be asymmetrical with respect to a zero potential line. This condition is illustrated in FIG. 2.

As a practical matter, it is not necessary for the devices 18 and 24 to be complementary pairs; the desired degree of asymmetry can be achieved by placing meters 26 and 28 into the circuit paths 11 and 20, respectively. By observing the currents through the meters, the potentiometer 16 can be adjusted to provide a desired ratio between the readings of the meters 26 and 28.

The control unit 10 is illustrated with a highly advantageous biasing arrangement for the devices 18 and 24. A potentiometer 30 is arranged to impress a desired portion of the alternating voltage from the power supply 12 onto each of the bases of the devices 18 and 24 simultaneously.

During a positive portion of the cycle of the current emanating from the power supply 12, the device 18 has its emitter-base junction forward biased and its collector-base junction reverse biased. Under these conditions, of course, the device 18 conducts current through the current path 11. The device 24, meanwhile, has its emitter-base junction reverse biased and its collector-base junction forward biased. Therefore, the device 24 does not permit conduction through the current path 20.

During the negative portion of the cycle of the alternating current emanating from the power supply 12, the biasing to the devices 18 and 24 is exactly reversed and device 18 fails to conduct while device 24 does conduct.

A simple adjustment of the potentiometer 30 will establish a desired level of biasing on both of the devices and will change the magnitude of the output current of the unit 10. The degree of asymmetry of the current is independent of the biasing level. The degree of asymmetry is, of course, established by adjusting the potentiometer 16. Thus, the control unit 10 can be readily adjusted to provide a desired degree of asymmetry and a desired magnitude of output current with virtually any combination of these two characteristics.

The biasing of the devices 18 and 24 need not be supplied directly from the power supply 12. A remote source of alternating biasing voltage (not shown) would work equally well. The only requirement of the remote source is that it must be synchronized with the power supply 12. In other words, the frequency of the remote source must be some even multiple of the frequency of the power supply 12.

While the inventive control unit 10 is illustrated in FIG. 2 as functioning with sinusoidal current waveforms, it should be understood that the unit is capable of controlling alternating currents with substantially any waveshape, for example, triangular or square shaped waves.

OPERATION

The inventive current control unit 10 is particularly useful in the electroplating of gold onto slices of silicon 32 on which integrated circuits have been formed.

To achieve such plating, the collectors of the devices 18 and 24 are connected in parallel at an output terminal 34. The silicon slice 32 is held with a vacuum chuck 36 which is electrically connected to the output terminal 34. A metallic plating tank 38 is connected to a second output terminal 40 of the control unit 10. A solution 42 of plating salts is held within the tank 38. For the plating of gold onto integrated circuits, the bath 42 is advantageously composed of potassium gold cyanide in a phosphate solution.

The tank 38 forms the anode, while the silicon slice 32 forms the cathode of the plating system. When the current is negative, metal is deposited. When the current is positive, metal is removed. For a net accumulation of metal, the negative current must exceed the positive current. This condition is the asymmetry illustrated in FIG. 2.

Plating is advantageously carried out by the so-called meniscus method wherein the slice 32 is brought into contact with the surface of the bath 42 so that a meniscus forms under the slice. The position of the slice 32 is carefully controlled so that the slice is not submerged within the bath 42. In this way, application of gold is limited to only the contacting surface of the slice 32.

To begin a typical plating operation, the terminals 34 and 40 are shorted together and the potentiometer 30 is adjusted to provide a desired current through a meter 44. After the desired current is established, the shorting connection (not shown) is removed. The predetermined current level established on the meter 44 will be maintained by the control unit 10 throughout the plating operation even though the concentration of the salts in the bath 42 changes quite substantially.

Although certain embodiments of the invention have been shown in the drawing and described in the specification, it is to be understood that the invention is not limited thereto, is capable of modification and can be arranged without departing from the spirit and scope of the invention.

What is claimed is:

1. Apparatus for supplying asymmetrical alternating current of controlled magnitude from an alternating-current power supply to a load, which comprises:

a first means having a high output impedance for conducting positive currents from said supply to the load;

a second means having a high output impedance for conducting negative currents from said supply to the load;

means for varying simultaneously but in opposite senses input currents to said first and second conducting means to provide a variable ratio between the positive and the negative currents;

means, independent of variations of the load, for varying simultaneously and in the same sense the output current of said first and second conducting means; and means for connecting the outputs of said first and second conducting means to the load to provide the load with a controlled magnitude alternating current having the desired ratio.

2. The apparatus of claim 1 wherein the first conducting means is a PNP transistor and the second conducting means is an NPN transistor.

3. The apparatus of claim 2 wherein the means for varying input currents to the transistors includes a potentiometer arranged with a first resistance leg connected to the emitter of the first transistor and a second resistance leg connected to the emitter of the second transistor whereby variation of the resistance ratios of the legs of the potentiometer will vary the input currents to the transistors providing the desired ratio.

4. The apparatus of claim 3 wherein the two transistors are each base-biased from a single variable source synchronized with the power supply whereby for any particular ratio of current a single adjustment in base-bias achieves a change in current having the desired ratio of positive to negative.

5. The apparatus of claim 2, wherein the means for varying the input currents to the transistors include a potentiometer having its fixed ends connected between the emitters of the transistors and its variable tap connected to the power supply; and the means for varying the output currents of said transistors includes a potentiometer having its fixed ends connected across the power supply and its variable tap connected to the bases of the transistors.

6. Apparatus for plating an article with asymmetrical, controlled-magnitude, alternating-current, which comprises:

a plating bath having cathode and anode connection means;

an alternating-current power supply;

a first transistor having a high output impedance for conducting positive currents from the power supply to the plating bath;

a second transistor having a high output impedance for conducting negative currents from the power supply to the plating bath;

means for controlling input currents to said separate transistors to provide a desired ratio between the current to the first transistor and the current to the second transistor;

biasing means, synchronized with the power supply, for controlling the output current of said transistors; and means for connecting the outputs of both transistors to a single terminal of the plating bath in parallel whereby plating can be performed with an asymmetrical alternating-current waveshape with a desired ratio between the positive and negative portions of the plating current.

7. Apparatus for supplying alternating current of a controlled asymmetry and a controlled magnitude from a source of alternating current to a load, which comprises:

a first potentiometer connected to an output terminal of said source, said potentiometer having a first and second resistance leg;

a PNP transistor with a high output impedance having its emitter connected to the first resistance leg of said first potentiometer and its collector connected to an output terminal;

an NPN transistor with a high output impedance having its emitter connected to the second resistance leg of said first potentiometer and its collector connected to the output terminal to which the collector of the PNP transistor is connected; and a biasing potentiometer connected to simultaneously provide a desired portion of the output from the source to the base of both the NPN and the PNP transistors to cause the PNP transistor to conduct during a positive portion of a cycle of current emanating from the source and to cause the NPN transistor to conduct during a negative portion of said cycle whereby a desired degree of asymmetry of the output current can be provided by varying the ratio of the first and second resistance legs of the first potentiometer and the magnitude of the current can be controlled, irrespective of load, by varying the biasing potentiometer.

References Cited

UNITED STATES PATENTS

| | | | |
|---|---|---|---|
| 3,597,339 | 8/1971 | Newman et al. | 204—228 X |
| 3,153,187 | 10/1964 | Klees | 323—22 |
| 3,622,804 | 11/1971 | Mitchell, Jr. | 204—228 X |

FOREIGN PATENTS

| | | | |
|---|---|---|---|
| 549,691 | 12/1957 | Canada | 204—Dig. 009 |
| 736,107 | 8/1955 | Great Britain | 204—Dig. 009 |

JOHN H. MACK, Primary Examiner

D. R. VALENTINE, Assistant Examiner

U.S. Cl. X.R.

204—DIG. 8, DIG. 9; 324—22 T, 24, 25